US011176992B2

(12) United States Patent
Lee

(10) Patent No.: US 11,176,992 B2
(45) Date of Patent: Nov. 16, 2021

(54) MEMORY WRITE OPERATION APPARATUS AND METHOD

(71) Applicant: REALTEK SEMICONDUCTOR CORPORATION, Hsinchu (TW)

(72) Inventor: Hung-Yu Lee, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/086,499

(22) Filed: Nov. 2, 2020

(65) Prior Publication Data

US 2021/0134354 A1 May 6, 2021

(30) Foreign Application Priority Data

Nov. 4, 2019 (TW) ................................. 108139854

(51) Int. Cl.
*G11C 11/4094* (2006.01)
*G11C 5/06* (2006.01)
*G11C 11/4096* (2006.01)
*G11C 11/4074* (2006.01)

(52) U.S. Cl.
CPC ............ *G11C 11/4094* (2013.01); *G11C 5/06* (2013.01); *G11C 11/4074* (2013.01); *G11C 11/4096* (2013.01)

(58) Field of Classification Search
CPC ................................................ G11C 11/4094
See application file for complete search history.

(56) References Cited

U.S. PATENT DOCUMENTS

| 8,233,342 | B2  |   | 7/2012 | Adams et al. |
|-----------|-----|---|--------|--------------|
| 8,363,453 | B2  |   | 1/2013 | Arsovski et al. |
| 8,441,874 | B2  |   | 5/2013 | Sinha et al. |
| 9,070,432 | B2  |   | 6/2015 | Hsieh et al. |
| 9,875,790 | B1  | * | 1/2018 | Sinha ...................... G11C 7/12 |
| 10,217,496 | B1 | * | 2/2019 | Nautiyal ............. G11C 11/4097 |
| 2007/0081379 | A1 | * | 4/2007 | Clinton ................. G11C 11/419 365/149 |
| 2009/0235171 | A1 |   | 9/2009 | Adams et al. |
| 2010/0188909 | A1 |   | 7/2010 | Kenkare et al. |
| 2014/0160871 | A1 | * | 6/2014 | Zimmer ................... G11C 7/12 365/189.16 |
| 2016/0042784 | A1 | * | 2/2016 | Rim ....................... G11C 11/419 365/154 |
| 2016/0203857 | A1 | * | 7/2016 | Chandra ............... G11C 11/412 365/156 |
| 2017/0117034 | A1 | * | 4/2017 | Hebig ................... G11C 11/419 |

* cited by examiner

*Primary Examiner* — Douglas King
(74) *Attorney, Agent, or Firm* — WPAT, PC

(57) ABSTRACT

The present disclosure discloses a memory write operation apparatus to perform write operation on a selected memory unit coupled to two bit lines that includes a coupling capacitor, a charge sharing circuit, a write operation driving circuit, a charging circuit and a negative voltage coupling circuit. The charge sharing circuit electrically couples a first terminal of the coupling capacitor and a first bit line to receive charges therefrom to perform charging. The negative voltage coupling circuit electrically couples the first terminal of the coupling capacitor to a ground terminal during a negative voltage generation time period such that a second terminal of the coupling capacitor couples a negative voltage to the first bit line to perform write operation.

18 Claims, 6 Drawing Sheets

MEMORY WRITE OPERATION APPARATUS AND METHOD

BACKGROUND OF THE INVENTION

1. Field of the Invention

The present disclosure relates to a memory write operation apparatus and a memory write operation method.

2. Description of Related Art

Static random access memory (SRAM) is a kind of random access memory. A common SRAM includes a multiple of memory units arranged in an array each can be selected by using a word line and a pair of bit lines to perform either read operation or write operation.

In write operation, the pair of bit lines are driven by bit line signals having opposite states such that transistors corresponding to a pair of nodes of the memory unit turn on or turn off respectively to generate high and low voltage levels on the pair of nodes to result in a storage status. However, in advanced manufacturing processes, the requirement of the write operation ability on a conventional SRAM is higher since the current ability of the passing and pull-up transistors in the memory unit become closer such that the drain current of the passing transistor is hard to overcome the turned-on pull-up transistor current to pull down the high voltage of the stored node in write operation.

SUMMARY OF THE INVENTION

In consideration of the problem of the prior art, an object of the present disclosure is to provide a memory write operation apparatus and a memory write operation method.

The present disclosure discloses a memory write operation apparatus configured to perform write operation on a selected memory unit electrically coupled to two bit lines. The memory write operation apparatus includes a coupling capacitor, a charge sharing circuit, a write operation driving circuit, a charging circuit and a negative voltage coupling circuit. The coupling capacitor has a first terminal and a second terminal. In a charge sharing phase of a write period, the charge sharing circuit is configured to electrically couple the first terminal of the coupling capacitor to a first bit line of the two bit lines such that the coupling capacitor receives electric charges on the first bit line and is charged accordingly. The write operation driving circuit is configured to electrically couple the first bit line to the second terminal of the coupling capacitor in a write driving phase of the write period, wherein the write operation driving phase is subsequent to the charge sharing phase. The charging circuit is configured to electrically couple a voltage source to the first terminal of the coupling capacitor in the write operation driving phase, such that the voltage source charges the coupling capacitor. The negative voltage coupling circuit is configured to keep electrically coupling the second terminal of the coupling capacitor to a ground terminal prior to a negative voltage generation phase, which is subsequent to the write operation driving phase of the write period, in which the negative voltage generation phase is subsequent to the write operation driving phase, and electrically couple the first terminal of the coupling capacitor to the ground terminal in the negative voltage generation phase, such that the coupling capacitor electrically couples a negative voltage to the first bit line from the second terminal through the write operation driving circuit to perform write operation on the memory unit.

The present disclosure also discloses a memory write operation method used in a memory write operation apparatus configured to perform write operation on a selected memory unit electrically coupled to two bit lines. The memory write method includes the steps outlined below. A first terminal of a coupling capacitor is electrically coupled to a first bit line of the two bit lines by a charge sharing circuit in a charge sharing phase of a write period such that the coupling capacitor receives electric charges on the first bit line and is charged accordingly. The first bit line and second terminal of the coupling capacitor are started to be electrically coupled by a write operation driving circuit from a write operation driving phase of the write period, wherein the write operation driving phase is subsequent to the charge sharing phase. A voltage source is electrically coupled to the first terminal of the coupling capacitor by a charging circuit in the write operation driving phase, such that the voltage source charges the coupling capacitor. The second terminal of the coupling capacitor is kept to be electrically coupled to a ground terminal by a negative voltage coupling circuit, prior to a negative voltage generation phase of the write period, in which the negative voltage generation phase is subsequent to the write operation driving phase, and the first terminal of the coupling capacitor is electrically coupled to the ground terminal by the negative voltage coupling circuit in the negative voltage generation phase, such that the coupling capacitor electrically couples a negative voltage to the first bit line from the second terminal through the write operation driving circuit to perform write operation on the memory unit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory write operation apparatus and a memory write operation method with low power consumption.

Figure 1:
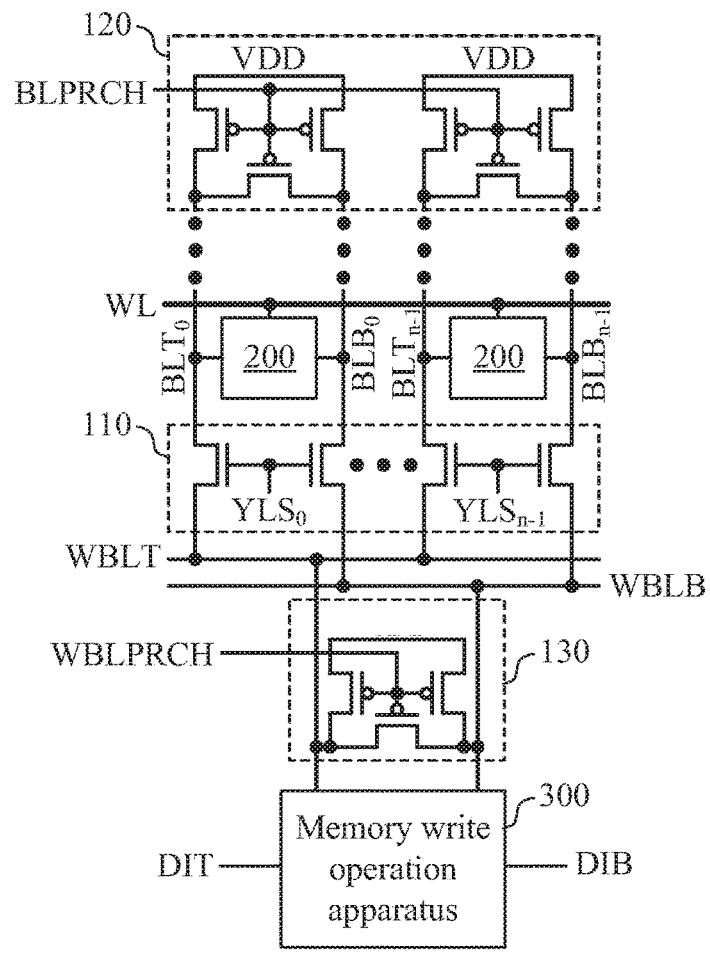
FIG. 1 illustrates a circuit diagram of a memory write operation apparatus according to an embodiment of the present invention.
Figure 2:
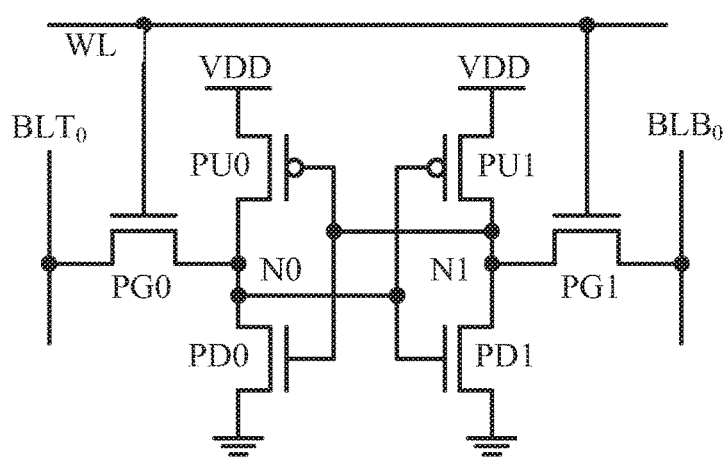
FIG. 2 illustrates a circuit diagram of a memory unit included in the memory system according to an embodiment of the present invention.

Reference is now made to FIG. 1 and FIG. 2. FIG. 1 illustrates a circuit diagram of a memory system 100 according to an embodiment of the present invention. FIG. 2 illustrates a circuit diagram of a memory unit 200 included in the memory system 100 according to an embodiment of the present invention.

In an embodiment, memory system 100 is an SRAM and includes the memory units 200, wherein each of the memory units 200 is an SRAM unit. In FIG. 1, 1 row and n columns of memory units 200 are exemplarily illustrated.

As illustrated in FIG. 1, the memory system 100 further includes bit lines $BLT_0$-$BLT_{n-1}$, bit lines $BLB_0$-$BLB_{n-1}$, Y-axis multiplexer circuit 110, a word line WL, a write bit line WBLT, a write bit line WBLB, a bit line pre-charging circuit 120, a write bit line pre-charging circuit 130 and a memory write operation apparatus 300.

The 1st column, the 2nd column, . . . to the n-th column of memory units 200 are respectively electrically coupled to a pair of first bit lines. For example, the 1st column of memory units 200 are electrically coupled to the bit lines $BLT_0$ and $BLB_0$. The 2nd column of memory units 200 are electrically coupled to the bit lines $BLT_1$ and $BLB_1$. Likewise, the n-th column of memory units 200 are electrically coupled to the bit lines $BLT_n$ and $BLB_{n-1}$.

The Y-axis multiplexer circuit 110 selects one column from the n columns of memory units 200 according to the Y-axis multiplexer selection signals $YLS_0$-$YLS_{n-1}$ to perform either write operation or read operation. The word line WL further select one row of memory units 200 according to the signal transmitted therethrough to perform either write operation or read operation.

The write bit line WBLT is electrically coupled to the bit lines $BLT_0$-$BLT_{n-1}$, and the write bit line WBLB is electrically coupled to the bit lines $BLB_0$-$BLB_{n-1}$.

The bit line pre-charging circuit 120 is electrically coupled to the bit lines $BLT_0$-$BLT_{n-1}$ and $BLB_0$-$BLB_{n-1}$. Prior to a write period, the bit line pre-charging circuit 120 turns on according to the voltage level of a pre-charging control signal BLPRCH to pre-charge the bit lines $BLT_0$-$BLT_{n-1}$ and $BLB_0$-$BLB_{n-1}$ to a high voltage level.

Similarly, the write bit line pre-charging circuit 130 is electrically coupled to the write bit lines WBLT and WBLB. Prior to a write period, the write bit line pre-charging circuit 130 turns on according to the voltage level of the pre-charging control signal BLPRCH to pre-charge the write bit lines WBLT and WBLB to a high voltage level.

When the writing period begins, the memory write operation apparatus 300 determines the storage status supposed to be written to the memory unit 200 according to the bit line control signals DIT and DIB. The memory write operation apparatus 300 further modifies the voltage levels of the bit lines BLT0-BLTn−1 and BLB0-BLBn−1 through the write bit lines WBLT and WBLB according to other internal control signals to accomplish a write operation on the selected memory unit 200.

It is appreciated that the memory system 100 described above is merely an example. In other embodiments, circuit components can be added or removed when the operation of the memory system 100 is not affected.

For example, in an embodiment, the memory system 100 may not include the write bit lines WBLT and WBLB. Under such a condition, the write bit line pre-charging circuit 130 can be removed. The memory write operation apparatus 300 can directly modify the voltage levels of the bit lines $BLT_0$-$BLT_{n-1}$ and $BLB_0$-$BLB_{n-1}$.

However, under such a condition, different columns of the memory units 200 need different memory write operation apparatus 300. The configuration shown in FIG. 1, in which n columns of memory units 200 shares one memory write operation apparatus 300, can not be used.

As illustrated in FIG. 2, the memory unit 200 includes storage transistors PU0, PU1, PD0 and PD1 and switch transistors PG0 and PG1.

The sources of the storage transistors PU0 and PU1 are electrically coupled to a voltage source VDD. The sources of the storage transistors PD0 and PD1 are electrically coupled to a ground terminal GND. The drains of the storage transistors PU0 and PD0 and the gates of the storage transistors PU1 and PD1 are electrically coupled to a node N0. The drains of the storage transistors PU1 and PD1 and the gates of the storage transistors PU0 and PD0 are electrically coupled to a node N1.

The two sources/drains of the switch transistor PG0 are electrically coupled to the node N0 and the bit line (e.g. the bit line $BLT_0$). The two sources/drains of the switch transistors PG1 are electrically coupled to the node N1 and the bit line (e.g. the bit line $BLB_0$). The gates of the switch transistors PG0 and PG1 are electrically coupled to the word line WL.

As a result, when the word line WL selects the memory unit 200, the switch transistors PG0 and PG1 turn on. When the bit line $BLT_0$ is at the high voltage level and the bit line $BLB_0$ is at the low voltage level, the storage transistors PU0 and PD1 turn off and the storage transistors PU1 and PD0 turn on. The node N0 is pulled to the high voltage level and the node N1 is pulled to the low voltage level. After the word line WL forces the switch transistors PG0 and PG1 to turn off, the memory unit 200 stores a first status.

On the contrary, when the bit line $BLT_0$ is at the low voltage level and the bit line $BLB_0$ is at the high voltage level, the node N0 is pulled to the low voltage level and the node N1 is pulled to the high voltage level. The memory unit 200 stores a second status.

In different embodiments, one of the first status and the second status is a high status and the other one is a low status.

Figure 3:
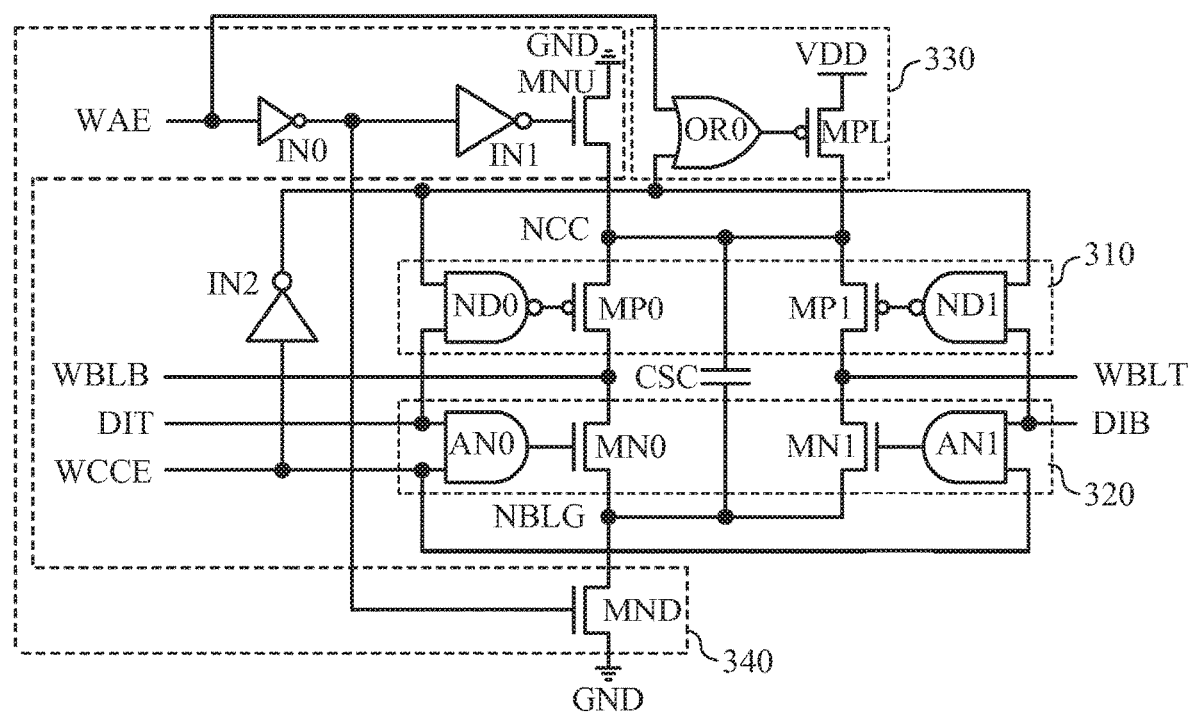
FIG. 3 illustrates a circuit diagram of the memory write operation apparatus according to an embodiment of the present invention.

Reference is now made to FIG. 3. FIG. 3 illustrates a circuit diagram of the memory write operation apparatus 300 according to an embodiment of the present invention.

The memory write operation apparatus 300 includes a coupling capacitor CSC, a charge sharing circuit 310, a write operation driving circuit 320, a charging circuit 330 and a negative voltage coupling circuit 340.

The coupling capacitor CSC has a first terminal NCC and a second terminal NBLG.

The charge sharing circuit 310 includes charge sharing control circuits ND0 and ND1 and charge sharing switches MP0 and MP1. In an embodiment, each of the charge sharing control circuits ND0 and ND1 is a NAND gate. Each of the charge sharing switches MP0 and MP1 is a PMOS transistor.

The charge sharing control circuit ND0 receives the bit line control signal DIT. The charge sharing control circuit ND1 receives the bit line control signal DIB. The charge sharing control circuit ND0 and ND1 simultaneously receive the driving control signal WCCE through the NOT gate IN2. The charge sharing switch MP0 and MP1 are controlled to turn on or turn off by the logic operation result of the charge sharing control circuit ND0 and ND1, respectively.

The write operation driving circuit 320 includes write operation driving control circuits AN0 and AN1 and write operation driving switches MN0 and MN1. In an embodiment, each of the write operation driving control circuits AN0 and AN1 is an AND gate, and each of the write operation driving switches MN0 and MN1 is a NMOS transistor.

The write operation driving control circuit AN0 and AN1 receive the bit line control signal DIT and DIB, respectively, and also receive the driving control signal WCCE. The write operation driving switch MN0 and MN1 are controlled to turn on or turn off by the logic operation result of the write operation driving control circuit AN0 and AN1, respectively.

The charge sharing switch MP0 and the write operation driving switch MN0 are both electrically coupled to the write bit line WBLB. The charge sharing switch MP1 and the write operation driving switch MN1 are both electrically coupled to the write bit line WBLT.

The charging circuit 330 includes a charging switch MPL and a control logic circuit OR0. The charging switch MPL is disposed between the voltage source VDD and the first terminal NCC of the coupling capacitor CSC. The control logic circuit OR0 receives a coupling control signal WAE, and receives the driving control signal WCCE through the NOT gate IN2. The charging switch MPL is controlled by the logic operation result of the control logic circuit OR0 to either turn on or turn off.

The negative voltage coupling circuit 340 includes a negative voltage coupling switch MND and a negative voltage coupling switch MNU. The negative voltage coupling switch MND receives the coupling control signal WAE through the NOT gate IN0. The negative voltage coupling switch MNU receives the coupling control signal WAE through the NOT gates IN0 and IN1.

Figure 4:
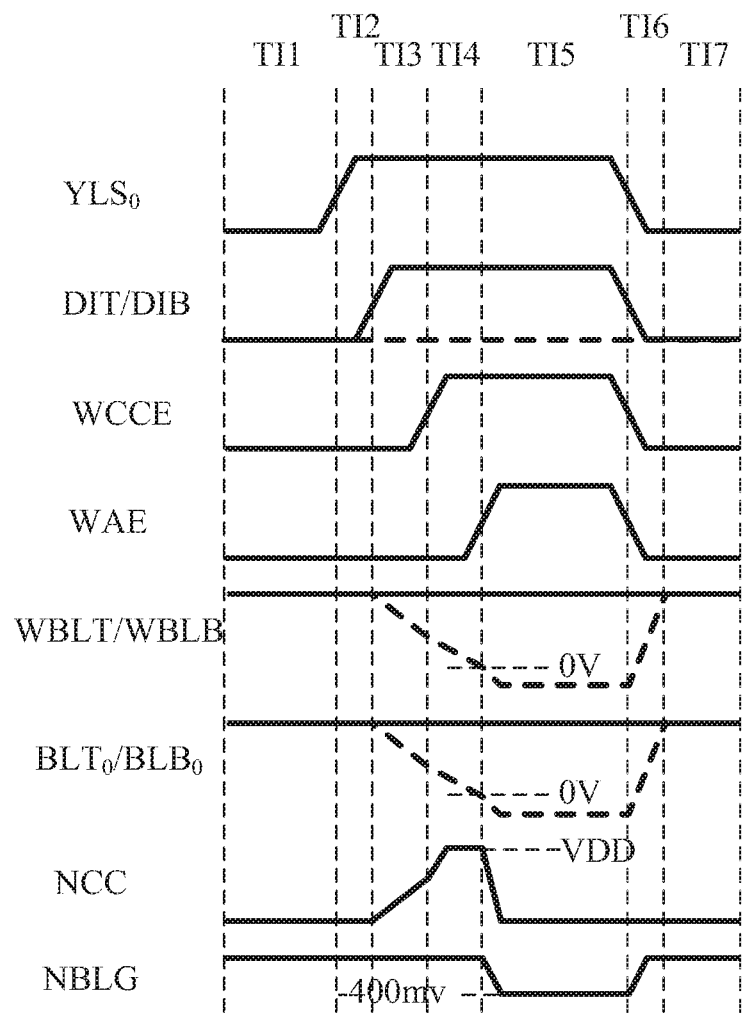
FIG. 4 illustrates a waveform diagram of waveforms of each of the control signals in the memory write operation apparatus in time phases according to an embodiment of the present invention.

Reference is now made to FIG. 4 at the same time. FIG. 4 illustrates a waveform diagram of waveforms of each of the control signal in the memory write operation apparatus 300 in time phases TI1-TI7 according to an embodiment of the present invention. The operation of the memory write operation apparatus 300 is described in detail in accompany with FIG. 3 and FIG. 4.

As illustrated in FIG. 4, the time phases TI2-TI6 are the write period. In the time phase TI1 prior to the write period, the bit lines, e.g. the bit lines $BLT_1$ and $BLB_1$ and the write bit lines WBLT and WBLB, are charged to the high voltage level by the bit line pre-charging circuit 120 and the write bit line pre-charging circuit 130.

When the write period starts, in the write preparation phase that the time phase TI2 corresponds to, the bit line pre-charging circuit 120 and the write bit line pre-charging circuit 130 turn off to keep the bit lines floating. The word line WL and the Y-axis multiplexer circuit 110 select the memory unit 200 to be written. Take the Y-axis multiplexer circuit 110 as an example, the 1st column of memory units 200 can be selected by the Y-axis multiplexer selection signal YLS0.

In the charge sharing phase that the time phase TI3 corresponds to, the charge sharing circuit 310 electrically couples the first terminal NCC of the coupling capacitor CSC to one of the write bit lines. The coupling capacitor CSC receives the electric charges from the write bit line and the corresponding bit line and is charged accordingly.

More specifically, from the charge sharing phase, the first charge sharing control circuit ND0 receives the bit line control signal DIT and receives the driving control signal WCCE through the NOT gate IN2. The second charge sharing control circuit ND1 receives the bit line control signal DIB and receives the driving control signal WCCE through the NOT gate IN2. The bit line control signals DIT and DIB have logic states inverse to each other.

In an embodiment, the bit line control signal DIT illustrated as a solid line in FIG. 4 is at the high voltage level. The bit line control signal DIB illustrated as a dashed line in FIG. 4 is at the low voltage level. The driving control signal WCCE is at the low voltage level in the charge sharing phase.

As a result, in such a time phase, the bit line control signal DIT has the high voltage level. The driving control signal WCCE is inverted by the NOT gate IN2 such that the inverted driving control signal WCCE has the high voltage level. The charge sharing control circuit ND0 generates the logic operation result having the low voltage level according to the bit line control signal DIT and the inverted driving control signal WCCE.

The charge sharing switch MP0 is thus enabled to electrically couple the first terminal NCC of the coupling capacitor CSC to the write bit line WBLB. The electric charges in the parasitic capacitors of the bit line BLB0 and the write bit line WBLB flow to the first terminal NCC of the coupling capacitor CSC due to the charge sharing activity.

The voltage level of the write bit line WBLB and the corresponding bit line BLB0 decreases from the pre-charged high voltage level, and the voltage level of the first terminal NCC increases. The voltage levels of the write bit line WBLB and the corresponding bit line BLB0 are illustrated as dashed lines in FIG. 4.

The bit line control signal DIB has the low voltage level. The driving control signal WCCE is inverted by the NOT gate IN2 such that the inverted driving control signal WCCE has the high voltage level. The charge sharing control circuit ND1 generates the logic operation result having the high voltage level according to the bit line control signal DIB and the inverted driving control signal WCCE.

The charge sharing switch MP1 is thus disabled to keep the write bit line WBLT floating. As a result, the voltage levels of the write bit line WBLT and the corresponding bit line BLT0 are kept high. The voltage levels of the write bit line WBLT and the corresponding bit line BLT0 are illustrated as solid lines in FIG. 4.

Also, in such a time phase, the driving control signal WCCE has the low voltage level. The bit line control signal DIT has the high voltage level. The write operation driving control circuit AN0 generates the logic operation result having the low voltage level accordingly to disable the write operation driving switch MN0.

On the other hand, the driving control signal WCCE has the low voltage level. The bit line control signal DIB has the low voltage level. The write operation driving control circuit AN1 generates the logic operation result having the low voltage level accordingly to disable the write operation driving switch MN1.

From the write operation driving phase that the time phase TI4 corresponds to, the write operation driving circuit 320 electrically couples one of the write bit line to the second terminal NBLG of the coupling capacitor CSC.

More specifically, from the write operation driving phase, the voltage level of the driving control signal WCCE turns high.

As a result, in such a time phase, the driving control signal WCCE having the high voltage level is inverted by the NOT gate IN2 such that the inverted driving control signal WCCE has the low voltage level. The bit line control signal DIT has the high voltage level. The charge sharing control circuit ND0 generates the logic operation result having the high voltage level accordingly to disable the charge sharing switch MP0.

On the other hand, the driving control signal WCCE having the high voltage level is inverted by the NOT gate IN2 such that the inverted driving control signal WCCE has the low voltage level. The bit line control signal DIB has the low voltage level. The charge sharing control circuit ND1 generates the logic operation result having the high voltage level accordingly to disable the charge sharing switch MP1.

The bit line control signal DIT has the high voltage level and the driving control signal WCCE has the high voltage level. The write operation driving control circuit AN0 generates the logic operation result having the high voltage level accordingly. The write operation driving switch MN0 is thus enabled to electrically couple the second terminal NBLG of the coupling capacitor CSC to the write bit line WBLB.

On the other hand, the bit line control signal DIB has the low voltage level and the driving control signal WCCE has the high voltage level. The write operation driving control circuit AN1 generates the logic operation result having the low voltage level accordingly. The write operation driving switch MN1 is thus disabled to keep the write bit line WBLT floating.

Furthermore, in the write operation driving phase, the negative voltage coupling circuit 340 electrically couples the second terminal NBLG of the coupling capacitor CSC to the ground terminal GND.

More specifically, in the time phase TI1-TI4, the coupling control signal WAE is kept in the low voltage level.

Under such a condition, the negative voltage coupling switch MND receives the coupling control signal WAE through the NOT gate IN0 to actually receive the high voltage level. The negative voltage coupling switch MND is thus enabled to electrically couple the second terminal NBLG of the coupling capacitor CSC to the ground terminal GND.

As a result, the voltage levels of the write bit line WBLB and the corresponding bit line BLB0 decreases to the voltage level of the ground terminal GND (0 volt). The negative voltage coupling switch MNU receives the coupling control signal WAE through the NOT gates IN0 and IN1 to actually receive the low voltage level. The negative voltage coupling switch MNU is thus disabled.

Moreover, the charging circuit 330 electrically couples the voltage source VDD to the first terminal NCC of the coupling capacitor CSC only in the write operation driving phase. As a result, the voltage source VDD charges the coupling capacitor CSC accordingly.

Under such a condition, the control logic circuit OR0 receives the coupling control signal WAE having the low voltage level. Further, the driving control signal WCCE is inverted by the NOT gate IN2 such that the control logic circuit OR0 receives the inverted driving control signal WCCE having the low voltage level. The control logic circuit OR0 generates the logic operation result having the low voltage level accordingly.

The charging switch MPL turns on due to the control of the logic operation result having the low voltage level. The voltage source VDD thus charges the coupling capacitor CSC through the first terminal NCC. The voltage level of the first terminal NCC increases to the voltage level of the voltage source VDD.

In the negative voltage generation phase that the time phase TI5 correspond to, the negative voltage coupling circuit 340 electrically couples the first terminal NCC of the coupling capacitor CSC to the ground terminal GND only in the negative voltage generation phase. As a result, the coupling capacitor CSC couples a negative voltage from the second terminal NBLG through the write operation driving circuit 320 to one of the write bit lines to perform write operation on the memory unit 200.

More specifically, in the time phase TI5, the coupling control signal WAE turns to the high voltage level.

Under such a condition, the negative voltage coupling switch MND receives the coupling control signal WAE through the NOT gate IN0 to actually receive the low voltage level. The negative voltage coupling switch MND is thus disabled.

The negative voltage coupling switch MNU receives the coupling control signal WAE through the NOT gates IN0 and IN1 to actually receive the high voltage level. The negative voltage coupling switch MNU is thus enabled to electrically couple the first terminal NCC of the coupling capacitor CSC to the ground terminal GND.

In order to balance the voltages of the two terminals of the coupling capacitor CSC, a negative voltage is generated at the second terminal NBLG. The negative voltage is coupled to the write bit line WBLB through the write operation driving switch MN0 of the write operation driving circuit 320. The voltage levels of the second terminal NBLG, the write bit line WBLB and the corresponding bit line BLB0 are all pulled to the negative voltage level.

In a numerical example, the negative voltage level is −400 millivolts. However, the actual value of the negative voltage generated by the coupling capacitor CSC depends on the capacity and the charged amount of the coupling capacitor CSC.

Further, the control logic circuit OR0 receives the coupling control signal WAE having the high voltage level. The driving control signal WCCE having the high voltage level is inverted by the NOT gate IN2 such that the inverted driving control signal WCCE has the low voltage level. As a result, the control logic circuit OR0 also receives the inverted driving control signal WCCE. The charging circuit 330 generates the logic operation result having the high voltage level accordingly to disable the charging switch MPL. The charging activity of the voltage source VDD is thus stopped.

It is appreciated that the write bit line WBLT is kept floating since the charge sharing switch MP1 and the write operation driving switch MN1 are disabled. The high voltage level of the write bit line WBLT generated due to the pre-charging operation is kept.

Under such a condition, take the memory unit 200 in the 1st column as an example, the write bit line WBLB has the low voltage level lower than the normal voltage level of the ground terminal. The write bit line WBLT has the high voltage level. The write bit line WBLB forces the bit line $BLB_0$ corresponding to the memory unit 200 to have the low voltage level lower than the normal voltage level of the ground terminal. The write bit line WBLT forces the bit line $BLT_0$ corresponding to the memory unit 200 to have the high voltage level.

The storage transistors PU0 and PD1 in FIG. 2 thus turn on, and the storage transistors PU1 and PD0 turn off. The node N0 is pulled to the high voltage level. The node N1 is pulled to the low voltage level lower than the normal voltage level of the ground terminal.

As a result, even the current draining ability of the switch transistors PG1 is worse than the current suppling ability of the storage transistors PU1, the node N1 can still be guaranteed to have a voltage level that is low enough. The current supplying ability of the storage transistors PU0 can be guaranteed as well to make sure the voltage level of the node N0 is at a voltage level that is high enough. The memory unit 200 can thus accurately store the first status.

It is appreciated that in the embodiment described above, the bit line control signal DIT has the high voltage level and the bit line control signal DIB has the low voltage level. The write operation performed on the memory unit 200 accordingly to store the first status is merely an example. In another embodiment, the same process can be performed on the memory unit 200 by using the bit line control signal DIT having the low voltage level and the bit line control signal DIB having the high voltage level. Under such a condition, the memory unit 200 stores a second status. The detail of such a process is not described herein.

In an embodiment, in the period terminating phase that the time phase TI6 corresponds to, the bit line control signals DIT and DIB, the driving control signal WCCE and the coupling control signal WAE return to the low voltage level such that the write period terminates in the time phase TI7.

As a result, in the memory write operation apparatus 300 of the present invention, the electric charges stored by the parasitic capacitors on the bit lines during the pre-charging operation can be used by the charge sharing circuit 310 to charge the coupling capacitor CSC. Subsequently, the charging circuit 330 can charge the coupling capacitor CSC. The negative voltage is further generated according to the charging result. The accurate storage logic status of the memory unit 200 can be guaranteed. The memory write operation apparatus 300 can greatly reduce the power required to charge the coupling capacitor CSC.

Further, the charge sharing switches MP0 and MP1 and the write operation driving switches MN0 and MN1 implemented by the MOS transistors in FIG. 3 can also be implemented by transmission gates. The operation of the switches implemented by the transmission gate is identical to the operation of the switches implemented by the MOS transistors. The detail of the operation is not described herein.

Figure 5:
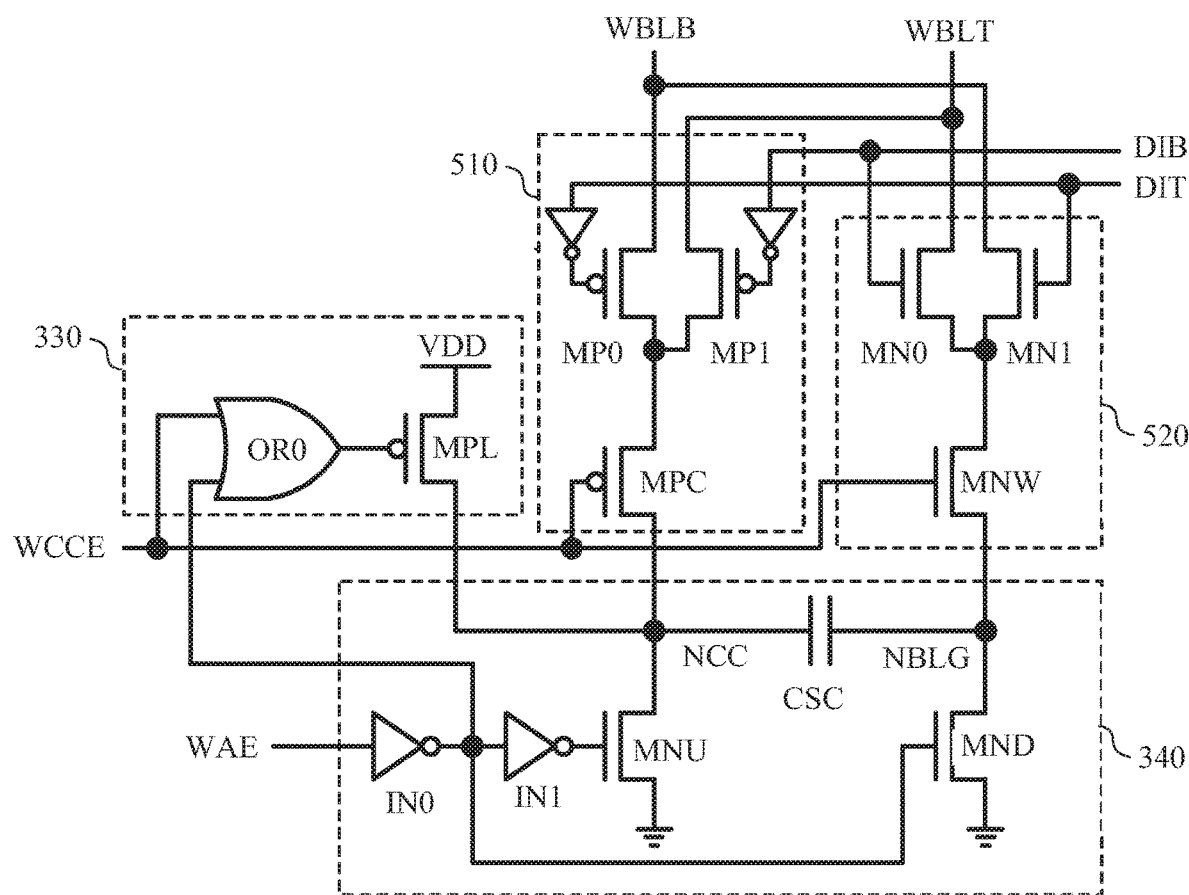
FIG. 5 illustrates a circuit diagram of a memory write operation apparatus according to an embodiment of the present invention.

Reference is now made to FIG. 5. FIG. 5 illustrates a circuit diagram of a memory write operation apparatus 500 according to an embodiment of the present invention.

Similar to the memory write operation apparatus 300 in FIG. 3, the memory write operation apparatus 500 in FIG. 5 includes the coupling capacitor CSC, a charge sharing circuit 510, a write operation driving circuit 520, the charging circuit 330 and the negative voltage coupling circuit 340. The coupling capacitor CSC, the charging circuit 330 and the negative voltage coupling circuit 340 are identical to the corresponding components in FIG. 3. No detail thereof is described herein.

In the present embodiment, the charge sharing circuit 510 includes a charge sharing control circuit MPC and the charge sharing switches MP0 and MP1. The write operation driving circuit 520 includes a write operation driving control circuit MNW and the write operation driving switches MN0 and MN1.

The charge sharing control circuit MPC receive the driving control signal WCCE and either turn on or turn off according to the control of the driving control signal WCCE. Identically, the write operation driving control circuit MNW receives the driving control signal WCCE and either turn on or turn off according to the control of the driving control signal WCCE.

The charge sharing switch MP0 and the write operation driving switch MN0 are electrically coupled to the write bit line WBLB. The charge sharing switch MP1 and the write operation driving switch MN1 are electrically coupled to the write bit line WBLT. The charge sharing switch MP0 receives the inverted bit line control signal DIT. The write operation driving switch MN0 receives the bit line control signal DIT. The charge sharing switch MP1 receives the inverted bit line control signal DIB. The write operation driving switch MN1 receives the bit line control signal DIB.

In the charge sharing phase that the time phase TI3 corresponds to, the driving control signal WCCE has the low voltage level such that the charge sharing control circuit MPC is enabled according to the driving control signal WCCE. The bit line control signal DIT having the high voltage level such that the charge sharing switch MP0 is enabled according to the bit line control signal DIT. The write bit line WBLB thus electrically couples to the first terminal NCC of the coupling capacitor CSC through the charge sharing switch MP0 and the charge sharing control circuit MPC.

On the other hand, the bit line control signal DIB has the low voltage level such that the charge sharing switch MP1 is disabled according to the bit line control signal DIB to keep the write bit line WBLT floating. The driving control signal WCCE has the low voltage level such that the write operation driving control circuit MNW is disabled according to the driving control signal WCCE.

In the write operation driving phase that the time phase TI4 corresponds to, the inverted driving control signal WCCE has the high voltage level such that the charge sharing control circuit MPC is disabled. The driving control signal WCCE has the high voltage level such that the write operation driving control circuit MNW is enabled. The bit line control signal DIT has the high voltage level such that the write operation driving switch MN1 is enabled.

As a result, the write bit line WBLB electrically couples to the second terminal NBLG of the coupling capacitor CSC through the write operation driving switch MN1 and the write operation driving control circuit MNW. The bit line control signal DIB has the low voltage level such that the write operation driving switch MN0 is disabled to keep the write bit line WBLT floating.

As a result, the memory write operation apparatus 500 provides another circuit configuration to accomplish the same operation result.

Figure 6:
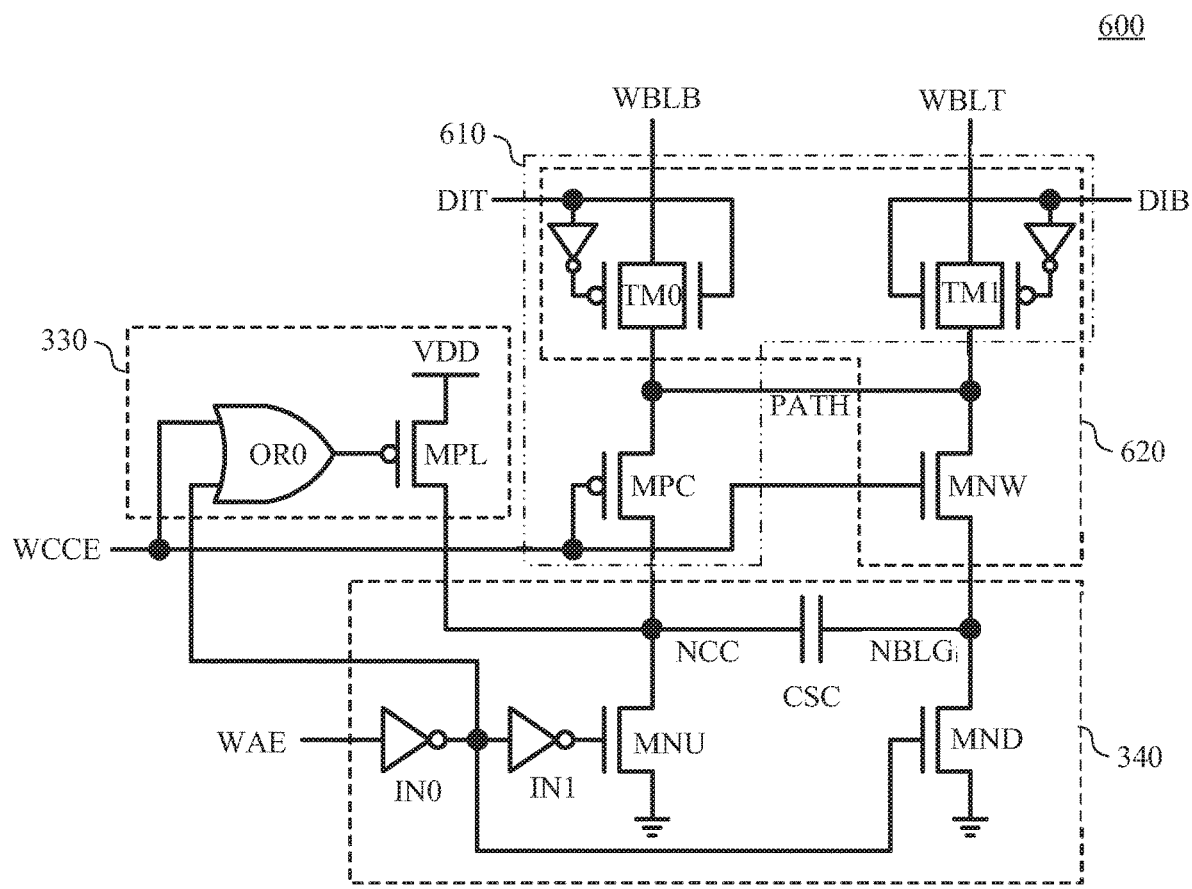
FIG. 6 illustrates a circuit diagram of a memory write operation apparatus according to an embodiment of the present invention.

Reference is now made to FIG. 6. FIG. 6 illustrates a circuit diagram of a memory write operation apparatus 600 according to an embodiment of the present invention.

Similar to the memory write operation apparatus 500 in FIG. 5, the memory write operation apparatus 600 in FIG. 6 includes the coupling capacitor CSC, a charge sharing circuit 610, a write operation driving circuit 620, the charging circuit 330 and the negative voltage coupling circuit 340. The coupling capacitor CSC, the charging circuit 330 and the negative voltage coupling circuit 340 are identical to the corresponding components in FIG. 5. No detail thereof is described herein.

In the present embodiment, the charge sharing circuit 610 includes the charge sharing control circuit MPC and transmission gates TM0 and TM1. The write operation driving circuit 620 includes the write operation driving control circuit MNW and transmission gates TM0 and TM1.

The charge sharing control circuit MPC receives the driving control signal WCCE and either turn on or turn off according to the control of the driving control signal WCCE. The write operation driving control circuit MNW receives the driving control signal WCCE and either turn on or turn off according to the control of the driving control signal WCCE.

The transmission gate TM0 is electrically coupled to the write bit line WBLB and receives the bit line control signal DIT. The transmission gate TM1 is electrically coupled to the write bit line WBLT and receives the bit line control signal DIB. The transmission gates TM0 and TM1 further electrically couple to each other through a connection path PATH.

In the charge sharing phase that the time phase TI3 corresponds to, the driving control signal WCCE has the low voltage level such that the charge sharing control circuit MPC is enabled. The bit line control signal DIT has the high voltage level such that the transmission gate TM0 is enabled.

As a result, the write bit line WBLB electrically couples to the first terminal NCC of the coupling capacitor CSC through the transmission gate TM0 and the charge sharing control circuit MPC. The bit line control signal DIB has the low voltage level such that the transmission gate TM1 is disabled to keep the write bit line WBLT floating. The driving control signal WCCE has the low voltage level such that the write operation driving control circuit MNW is disabled.

In the write operation driving phase that the time phase TI4 corresponds to, the driving control signal WCCE has the high voltage level such that the charge sharing control circuit MPC is disabled. The driving control signal WCCE has the high voltage level such that the write operation driving control circuit MNW is enabled. The bit line control signal DIT has the high voltage level such that the transmission gate TM0 is enabled.

As a result, the write bit line WBLB electrically couples to the second terminal NBLG of the coupling capacitor CSC through the transmission gate TM0, the connection path PATH and the write operation driving control circuit MNW. The bit line control signal DIB has the low voltage level such that the transmission gate TM1 is disabled to keep the write bit line WBLT floating.

As a result, the memory write operation apparatus 600 provides another circuit configuration to accomplish the same operation result.

Figure 7:
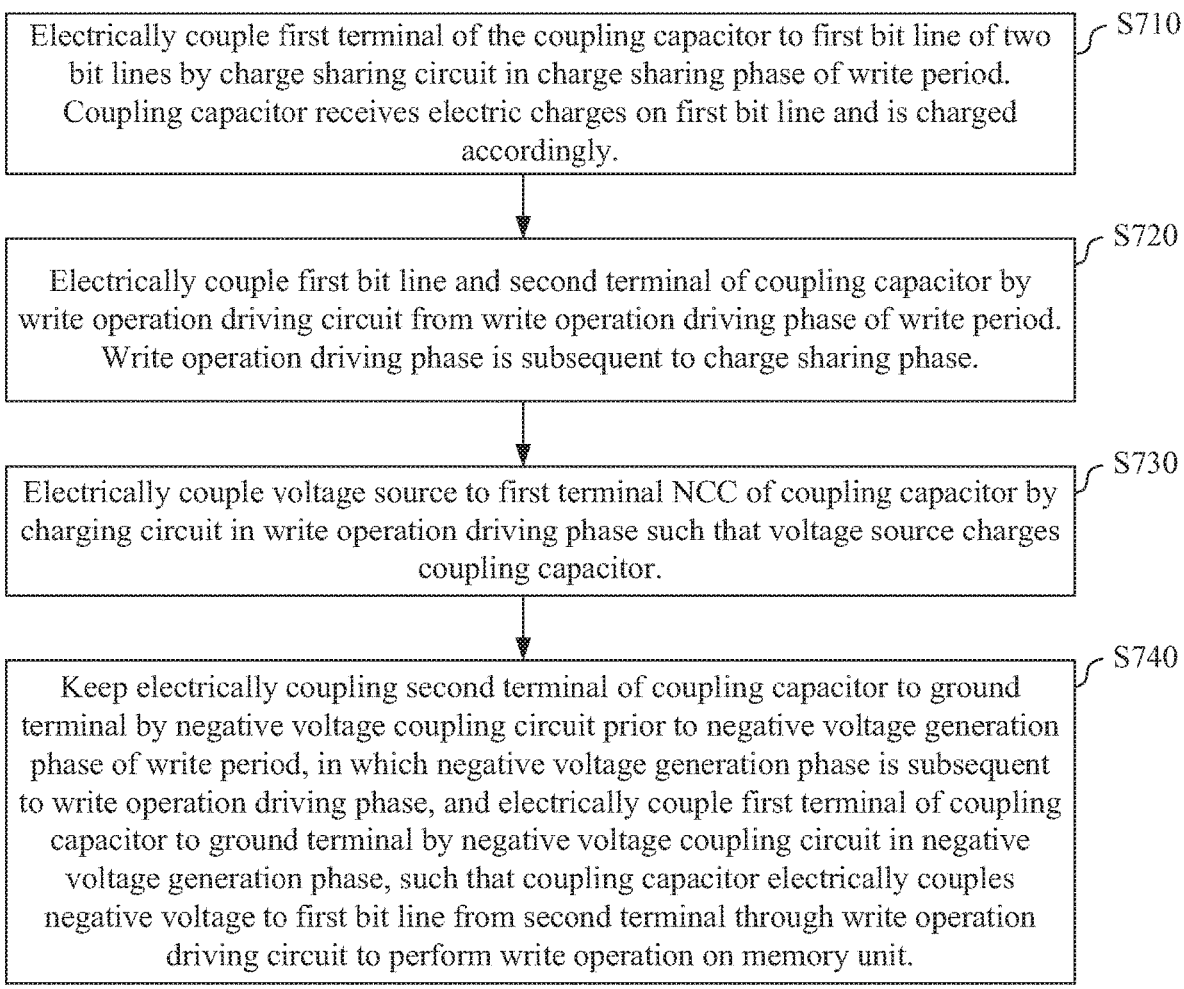
FIG. 7 illustrates a flow chart of a memory write operation method according to an embodiment of the present invention.

Reference is now made to FIG. 7. FIG. 7 illustrates a flow chart of a memory write operation method 700 according to an embodiment of the present invention.

Besides the apparatus described above, the present invention further discloses the memory write operation method 700 that can be used in such as, but not limited to the memory write operation apparatus 300, 500 and 600 illustrated in FIG. 3, FIG. 5 and FIG. 6. An embodiment of the memory write operation method 700 is illustrated in FIG. 7 and includes the steps outlined below.

In step S710, the first terminal NCC of the coupling capacitor CSC is electrically coupled to the first bit line (e.g. the bit line BLB corresponding to the write bit line WBLB) of the two bit lines by the charge sharing circuit 310 in the charge sharing phase of the write period. The coupling capacitor CSC receives electric charges on the first bit line and is charged accordingly.

In step S720, the first bit line and the second terminal NBLG of the coupling capacitor CSC are electrically coupled by the write operation driving circuit 320 from the write operation driving phase of the write period, wherein the write operation driving phase is subsequent to the charge sharing phase.

In step S730, the voltage source VDD is electrically coupled to the first terminal NCC of the coupling capacitor CSC by the charging circuit 330 in the write operation driving phase such that the voltage source VDD charges the coupling capacitor CSC.

In step S740, the second terminal NBLG of the coupling capacitor CSC is kept to be electrically coupled to the ground terminal GND by the negative voltage coupling circuit 340 prior to a negative voltage generation phase of the write period, in which the negative voltage generation phase is subsequent to the write operation driving phase, and the first terminal NCC of the coupling capacitor CSC is electrically coupled to the ground terminal GND by the negative voltage coupling circuit 340 in the negative voltage generation phase, such that the coupling capacitor CSC electrically couples the negative voltage to the first bit line from the second terminal NBLG through the write operation driving circuit 320 to perform write operation on the memory unit 200.

It is appreciated that the embodiments described above are merely an example. In other embodiments, it should be appreciated that many modifications and changes may be made by those of ordinary skill in the art without departing, from the spirit of the invention.

In summary, the memory write operation apparatus and the memory write operation method of the present invention can guarantee the accuracy of the stored logic status of the memory unit while reducing the power used to charge the coupling capacitor.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory write operation apparatus configured to perform write operation on a selected memory unit electrically coupled to two bit lines, the memory write operation apparatus comprising:
   a coupling capacitor having a first terminal and a second terminal;
   a charge sharing circuit configured to electrically couple the first terminal of the coupling capacitor to a first bit line of the two bit lines in a charge sharing phase of a write period, such that the coupling capacitor receives electric charges from the first bit line and is charged accordingly;
   a write operation driving circuit configured to electrically couple the first bit line to the second terminal of the coupling capacitor from a write operation driving phase of the write period, wherein the write operation driving phase is subsequent to the charge sharing phase;
   a charging circuit configured to electrically couple a voltage source to the first terminal of the coupling capacitor in the write operation driving phase such that the voltage source charges the coupling capacitor; and
   a negative voltage coupling circuit configured to keep electrically coupling the second terminal of the coupling capacitor to a ground terminal prior to a negative voltage generation phase of the write period, in which the negative voltage generation phase is subsequent to the write operation driving phase, and electrically couple the first terminal of the coupling capacitor to the ground terminal in the negative voltage generation phase, such that the coupling capacitor electrically couples a negative voltage to the first bit line from the second terminal through the write operation driving circuit to perform write operation on the memory unit.

2. The memory write operation apparatus of claim 1, wherein the charge sharing circuit and the write operation driving circuit are further configured to keep a second bit line of the two bit lines floating in the write period to keep the second bit line at a high voltage level to perform write operation on the memory unit.

3. The memory write operation apparatus of claim 2, wherein the charge sharing circuit further comprises a first and a second charge sharing control circuits and a first and a second charge sharing switches, and the write operation driving circuit comprises a first and a second write operation driving control circuits and a first and a second write operation driving switches, wherein the first charge sharing control circuit and the first write operation driving control circuit start to receive a first bit line control signal from the charge sharing phase and the second charge sharing control circuit and the second write operation driving control circuit start to receive a second bit line control signal having a phase inverse to the first bit line control signal from the charge sharing phase;

wherein in the charge sharing phase:
the first charge sharing control circuit enables the first charge sharing switch according to a driving control signal and the first bit line control signal, such that the first charge sharing switch turns on to electrically couple the first terminal of the coupling capacitor to the first bit line, and the second charge sharing control circuit disables the second charge sharing switch according to the driving control signal and the second bit line control signal to keep the second bit line floating; and
the first and the second write operation driving control circuits disable the first and the second write operation driving switches according to the driving control signal and the first and the second bit line control signals;

in the write operation driving phase:
the first and the second charge sharing control circuits disable the first and the second charge sharing switches according to the inverted driving control signal and the first and the second bit line control signals;
the first write operation driving control circuit enables the first write operation driving switch according to the inverted driving control signal and the first bit line control signal, such that the first write operation driving switch turns on to electrically couple the second terminal of the coupling capacitor to the first bit line, and the second write operation driving control circuit disables the second write operation driving switch according to the inverted driving control signal and the second bit line control signal to keep the second bit line floating.

4. The memory write operation apparatus of claim 3, wherein each of the first and the second charge sharing control circuits and the first and the second write operation driving control circuits is a logic gate, and each of the first and the second charge sharing switches and the first and the second write operation driving switches is a MOS transistor or a transmission gate.

5. The memory write operation apparatus of claim 2, wherein the charge sharing circuit further comprises a charge sharing control circuit and a first and a second charge sharing switches, and the write operation driving circuit comprises a write operation driving control circuit and a first and a second write operation driving switches, wherein the first charge sharing switch and the first write operation driving switch are electrically coupled to the first bit line and start to receive a first bit line control signal from the charge sharing phase, the second charge sharing switch and the second write operation driving switch are electrically coupled to the second bit line and start to receive a second bit line control signal having a phase inverse to the first bit line control signal from the charge sharing phase;

wherein in the charge sharing phase:
the charge sharing control circuit is enabled according to a driving control signal, and the first charge sharing switch is enabled according to the first bit line control signal, such that the first bit line is electrically coupled to the first terminal of the coupling capacitor through the first charge sharing switch and the charge sharing control circuit, and the second charge sharing switch is disabled according to the second bit line control signal to keep the second bit line floating; and
the write operation driving control circuit is disabled according to the driving control signal;

in the write operation driving phase:
the charge sharing control circuit is disabled according to the inverted driving control signal; and
the write operation driving control circuit is enabled according to the inverted driving control signal, and the first write operation driving switch is enabled according to the first bit line control signal, such that the first bit line is electrically coupled to the second terminal of the coupling capacitor through the first write operation driving switch and the write operation driving control circuit, and the second write operation driving switch is disabled according to the second bit line control signal to keep the second bit line floating.

6. The memory write operation apparatus of claim 2, wherein the charge sharing circuit further comprises a charge sharing control circuit, a first and a second transmission gates, the write operation driving circuit further comprises a write operation driving control circuit and the first and the second transmission gates, the first transmission gate is electrically coupled to the first bit line and start to receive a first bit line control signal from the charge sharing phase, the second transmission gate is electrically coupled to the second bit line and start to receive a second bit line control signal having a phase inverse to the first bit line control signal from the charge sharing phase and the first transmission gate, and the second transmission gate is electrically coupled together through a connection path;

in the charge sharing phase:
the charge sharing control circuit is enabled according to a driving control signal, and the first transmission gate is enabled according to the first bit line control signal, such that the first bit line is electrically coupled to the first terminal of the coupling capacitor through the first transmission gate and the charge sharing control circuit, and the second transmission gate is disabled according to the second bit line control signal to keep the second bit line floating; and
the write operation driving control circuit is disabled according to the driving control signal;

in the write operation driving phase:
the charge sharing control circuit is disabled according to the inverted driving control signal; and
the write operation driving control circuit is enabled according to the inverted driving control signal, and the first transmission gate is enabled according to the first bit line control signal, such that the first bit line is electrically coupled to the second terminal of the coupling capacitor through the first transmission gate, the connection path and the write operation driving control circuit, and the second transmission gate is disabled according to the second bit line control signal to keep the second bit line floating.

7. The memory write operation apparatus of claim 1, wherein the charging circuit comprises:
a charging switch disposed between the voltage source and the first terminal of the coupling capacitor; and
a control logic circuit;
wherein prior to the write operation driving phase, the control logic circuit is configured to disable the charging switch according to a driving control signal and a coupling control signal;
in the write operation driving phase, according to the inverted driving control signal and the coupling control signal, the control logic circuit is configured to enable the charging switch to electrically couple the voltage source to the first terminal of the coupling capacitor, such that the voltage source charges the coupling capacitor;
in the negative voltage generation phase, the control logic circuit is configured to disable the charging switch according to the inverted driving control signal and the inverted coupling control signal.

8. The memory write operation apparatus of claim 7, wherein the negative voltage coupling circuit comprises:
a first negative voltage coupling switch configured to be enabled by receiving the inverted coupling control signal prior to the negative voltage generation phase to electrically couple the second terminal of the coupling capacitor to the ground terminal and to be disabled by receiving the coupling control signal in the negative voltage generation phase;
a second negative voltage coupling switch configured to be disabled by receiving the coupling control signal in the negative voltage generation phase prior to the negative voltage generation phase and to be enabled by receiving the inverted coupling control signal in the negative voltage generation phase to electrically couple the first terminal of the coupling capacitor to the ground terminal.

9. The memory write operation apparatus of claim 1, wherein the two bit lines are charged to a high voltage level by a pre-charging circuit in a pre-charging period prior to the write period, and the two bit lines are kept floating in a write preparation phase in the write period prior to the charge sharing phase due to the turn-off of the pre-charging circuit.

10. A memory write operation method used in a memory write operation apparatus configured to perform write operation on a selected memory unit electrically coupled to two bit lines, the memory write method comprising:
electrically coupling a first terminal of a coupling capacitor to a first bit line of the two bit lines by a charge sharing circuit in a charge sharing phase of a write period, such that the coupling capacitor receives electric charges on the first bit line and is charged accordingly;
starting to electrically couple the first bit line to the second terminal of the coupling capacitor by a write operation driving circuit from a write operation driving phase of the write period, wherein the write operation driving phase is subsequent to the charge sharing phase;
electrically coupling a voltage source to the first terminal of the coupling capacitor by a charging circuit in the write operation driving phase such that the voltage source charges the coupling capacitor; and
keeping electrically coupling the second terminal of the coupling capacitor to a ground terminal by a negative voltage coupling circuit prior to a negative voltage generation phase of the write period, in which the negative voltage generation phase is subsequent to the write operation driving phase, and electrically coupling the first terminal of the coupling capacitor to the ground terminal by the negative voltage coupling circuit in the negative voltage generation phase, such that the coupling capacitor electrically couples a negative voltage to the first bit line from the second terminal through the write operation driving circuit to perform write operation on the memory unit.

11. The memory write operation method of claim 10, wherein the charge sharing circuit and the write operation driving circuit are further configured to keep a second bit line of the two bit lines floating in the write period to keep the second bit line at a high voltage level to perform write operation on the memory unit.

12. The memory write operation method of claim 11, wherein the charge sharing circuit further comprises a first and a second charge sharing control circuits and a first and a second charge sharing switches, and the write operation driving circuit comprises a first and a second write operation driving control circuits and a first and a second write operation driving switches, wherein the first charge sharing control circuit and the first write operation driving control circuit start to receive a first bit line control signal from the charge sharing phase and the second charge sharing control circuit and the second write operation driving control circuit start to receive a second bit line control signal having a phase inverse to the first bit line control signal from the charge sharing phase, the memory write operation method further comprises:
in the charge sharing phase:
enabling the first charge sharing switch by the first charge sharing control circuit according to a driving control signal and the first bit line control signal, such that the first charge sharing switch turns on to electrically couple the first terminal of the coupling capacitor to the first bit line, and disabling the second charge sharing switch by the second charge sharing control circuit according to the driving control signal and the second bit line control signal to keep the second bit line floating; and
disabling the first and the second write operation driving switches by the first and the second write operation driving control circuits according to the driving control signal and the first and the second bit line control signals;
in the write operation driving phase:
disabling the first and the second charge sharing switches by the first and the second charge sharing control circuits according to the inverted driving control signal and the first and the second bit line control signals;
enabling the first write operation driving switch by the first write operation driving control circuit according to the inverted driving control signal and the first bit line control signal, such that the first write operation driving switch turns on to electrically couple the second terminal of the coupling capacitor to the first bit line, and disabling the second write operation driving switch by the second write operation driving control circuit according to the inverted driving control signal and the second bit line control signal to keep the second bit line floating.

13. The memory write operation method of claim 12, wherein each of the first and the second charge sharing control circuits and the first and the second write operation driving control circuits is a logic gate, and each of the first and the second charge sharing switches and the first and the second write operation driving switches is a MOS transistor or a transmission gate.

14. The memory write operation method of claim 11, wherein the charge sharing circuit further comprises a charge sharing control circuit and a first and a second charge sharing switches, and the write operation driving circuit comprises a write operation driving control circuit and a first and a second write operation driving switches, wherein the first charge sharing switch and the first write operation driving switch are electrically coupled to the first bit line and start to receive a first bit line control signal from the charge sharing phase, the second charge sharing switch and the second write operation driving switch are electrically coupled to the second bit line and start to receive a second bit line control signal having a phase inverse to the first bit line control signal from the charge sharing phase, the memory write operation method further comprises:
   in the charge sharing phase:
      enabling the charge sharing control circuit according to a driving control signal, and enabling the first charge sharing switch according to the first bit line control signal, such that the first bit line is electrically coupled to the first terminal of the coupling capacitor through the first charge sharing switch and the charge sharing control circuit, and disabling the second charge sharing switch according to the second bit line control signal to keep the second bit line floating; and
      disabling the write operation driving control circuit according to the driving control signal;
   in the write operation driving phase:
      disabling the charge sharing control circuit according to the inverted driving control signal; and
      enabling the write operation driving control circuit according to the inverted driving control signal, and enabling the first write operation driving switch according to the first bit line control signal, such that the first bit line is electrically coupled to the second terminal of the coupling capacitor through the first write operation driving switch and the write operation driving control circuit, and disabling the second write operation driving switch according to the second bit line control signal to keep the second bit line floating.

15. The memory write operation method of claim 11, wherein the charge sharing circuit further comprises a charge sharing control circuit, a first and a second transmission gates, the write operation driving circuit further comprises a write operation driving control circuit and the first and the second transmission gates, the first transmission gate is electrically coupled to the first bit line and start to receive a first bit line control signal from the charge sharing phase, the second transmission gate is electrically coupled to the second bit line and start to receive a second bit line control signal having a phase inverse to the first bit line control signal from the charge sharing phase and the first transmission gate and the second transmission gate is electrically coupled together through a connection path, the memory write operation method further comprises:
   in the charge sharing phase:
      enabling the charge sharing control circuit according to a driving control signal, and enabling the first transmission gate according to the first bit line control signal, such that the first bit line is electrically coupled to the first terminal of the coupling capacitor through the first transmission gate and the charge sharing control circuit, and disabling the second transmission gate according to the second bit line control signal to keep the second bit line floating; and
      disabling the write operation driving control circuit according to the driving control signal;
   in the write operation driving phase:
      disabling the charge sharing control circuit according to the inverted driving control signal; and
      enabling the write operation driving control circuit according to the inverted driving control signal, and enabling the first transmission gate according to the first bit line control signal, such that the first bit line is electrically coupled to the second terminal of the coupling capacitor through the first transmission gate, the connection path and the write operation driving control circuit, and disabling the second transmission gate according to the second bit line control signal to keep the second bit line floating.

16. The memory write operation method of claim 10, wherein the charging circuit comprises a charging switch disposed between the voltage source and the first terminal of the coupling capacitor and a control logic circuit, the memory write operation method further comprises:
   prior to the write operation driving phase, disabling the charging switch by the control logic circuit according to a driving control signal and a coupling control signal;
   in the write operation driving phase, according to the inverted driving control signal and the coupling control signal, enabling the charging switch by the control logic circuit to electrically couple the voltage source to the first terminal of the coupling capacitor, such that the voltage source charges the coupling capacitor;
   in the negative voltage generation phase, disabling the charging switch by the control logic circuit according to the inverted driving control signal and the inverted coupling control signal.

17. The memory write operation method of claim 16, further comprising:
   wherein comprises:
   enabling a first negative voltage coupling switch of the negative voltage coupling circuit by receiving the inverted coupling control signal prior to the negative voltage generation phase to electrically couple the second terminal of the coupling capacitor to the ground terminal and disabling the first negative voltage coupling switch by receiving the coupling control signal in the negative voltage generation phase;
   disabling a second negative voltage coupling switch of the negative voltage coupling circuit by receiving the coupling control signal in the negative voltage generation phase prior to the negative voltage generation phase and enabling the second negative voltage coupling switch by receiving the inverted coupling control signal in the negative voltage generation phase to electrically couple the first terminal of the coupling capacitor to the ground terminal.

18. The memory write operation method of claim 10, further comprising:
   charging the two bit lines to a high voltage level by a pre-charging circuit in a pre-charging period prior to the write period; and keeping the two bit lines floating in a write preparation phase in the write period prior to the charge sharing phase due to the turn-off of the pre-charging circuit.

* * * * *